(12) United States Patent
Kwak

(10) Patent No.: US 10,008,692 B2
(45) Date of Patent: Jun. 26, 2018

(54) DISPLAY APPARATUS

(71) Applicant: Samsung Display Co., Ltd., Yongin-si (KR)

(72) Inventor: Yunhee Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/149,623

(22) Filed: May 9, 2016

(65) Prior Publication Data

US 2017/0141349 A1 May 18, 2017

(30) Foreign Application Priority Data

Nov. 16, 2015 (KR) .................. 10-2015-0160455

(51) Int. Cl.
| | |
|---|---|
| *H01L 29/08* | (2006.01) |
| *H01L 29/04* | (2006.01) |
| *H01L 21/00* | (2006.01) |
| *H01L 51/52* | (2006.01) |
| *H01L 27/32* | (2006.01) |
| *H01L 51/56* | (2006.01) |
| *H01L 27/12* | (2006.01) |

(52) U.S. Cl.
CPC ........ *H01L 51/5246* (2013.01); *H01L 27/323* (2013.01); *H01L 27/3211* (2013.01); *H01L 27/3248* (2013.01); *H01L 27/3276* (2013.01); *H01L 51/5253* (2013.01); *H01L 51/5281* (2013.01); *H01L 51/5284* (2013.01); *H01L 51/56* (2013.01); *H01L 27/124* (2013.01); *H01L 27/1222* (2013.01); *H01L 27/3262* (2013.01); *H01L 2227/323* (2013.01); *H01L 2251/5338* (2013.01); *H01L 2251/558* (2013.01)

(58) Field of Classification Search
CPC . H01L 51/5246; H01L 51/5281; H01L 51/56; H01L 27/3211; H01L 27/323; H01L 27/3248; H01L 27/3276; H01L 27/1222; H01L 2251/5338; H01L 2251/558
USPC .................. 257/40, 59; 438/28; 349/110
See application file for complete search history.

(56) References Cited

U.S. PATENT DOCUMENTS

| | | | |
|---|---|---|---|
| 6,268,896 B1* | 7/2001 | Takasaki | ............... G02F 1/1339 349/110 |
| 2003/0117573 A1* | 6/2003 | Yi | ......................... G02F 1/1333 349/158 |
| 2004/0075801 A1 | 4/2004 | Choi et al. | |

(Continued)

FOREIGN PATENT DOCUMENTS

| | | |
|---|---|---|
| JP | 2012-069256 | 4/2012 |
| KR | 10-2004-0049754 | 6/2004 |

(Continued)

*Primary Examiner* — Dzung Tran
(74) *Attorney, Agent, or Firm* — H.C. Park & Associates, PLC

(57) ABSTRACT

A display apparatus includes: a first substrate; a second substrate disposed facing the first substrate; a display portion disposed on a surface of the first substrate facing the second substrate, the display portion including a plurality of light-emitting areas; a sealing member disposed between the first substrate and the second substrate, the sealing member bonding the first substrate and the second substrate; and a first black matrix disposed between the sealing member and the first substrate.

13 Claims, 4 Drawing Sheets

(56) References Cited

U.S. PATENT DOCUMENTS

| | | | | |
|---|---|---|---|---|
| 2007/0132381 A1* | 6/2007 | Hayashi | ............... | H01L 51/5253 313/512 |
| 2008/0192186 A1* | 8/2008 | Nakagawa | ............ | G02F 1/1339 349/106 |
| 2010/0019654 A1* | 1/2010 | Hayashi | ............... | H01L 51/5256 313/498 |
| 2011/0148831 A1* | 6/2011 | Tamaki | ............... | H01L 27/3276 345/206 |
| 2011/0267566 A1* | 11/2011 | Shiau | ................ | G02F 1/133512 349/110 |
| 2014/0042408 A1* | 2/2014 | Akagawa | ............ | H01L 51/5253 257/40 |
| 2015/0138470 A1 | 5/2015 | Kang et al. | | |

FOREIGN PATENT DOCUMENTS

| | | |
|---|---|---|
| KR | 10-2006-0125042 | 12/2006 |
| KR | 10-2012-0111394 | 10/2012 |

* cited by examiner

DISPLAY APPARATUS

CROSS-REFERENCE TO RELATED APPLICATION

This application claims priority from and the benefit of Korean Patent Application No. 10-2015-0160455, filed on Nov. 16, 2015, which is hereby incorporated by reference for all purposes as if fully set forth herein.

BACKGROUND

Field

Exemplary embodiments relate to a sealed display apparatus.

Discussion of the Background

Organic light-emitting display devices or liquid crystal displays including thin film transistors (TFTs) have been included in display apparatuses for mobile devices such as digital cameras, video cameras, camcorders, portable information terminals, or smartphones.

Such display apparatuses may include a sealing member to protect the display device from the outside. For example, the sealing member may be coated between a plurality of substrates and hardened by a laser beam radiated from a laser source, thereby bonding the substrates.

However, the laser radiated in a fan-out area, where a plurality of wires are formed, may generate short-circuit between wires due to heat generated by the radiated laser beam. Increasing a distance between wires may increase a dead space surrounding the display area.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus having a reduced size of dead space.

Additional aspects will be set forth in the detailed description which follows, and, in part, will be apparent from the disclosure, or may be learned by practice of the inventive concept.

An exemplary embodiment discloses a display apparatus that includes a first substrate; a second substrate disposed facing the first substrate; a display portion disposed on a surface of the first substrate facing the second substrate, the display portion including a plurality of light-emitting areas; a sealing member disposed between the first substrate and the second substrate, the sealing member bonding the first substrate and the second substrate; and a first black matrix disposed between the sealing member and the first substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
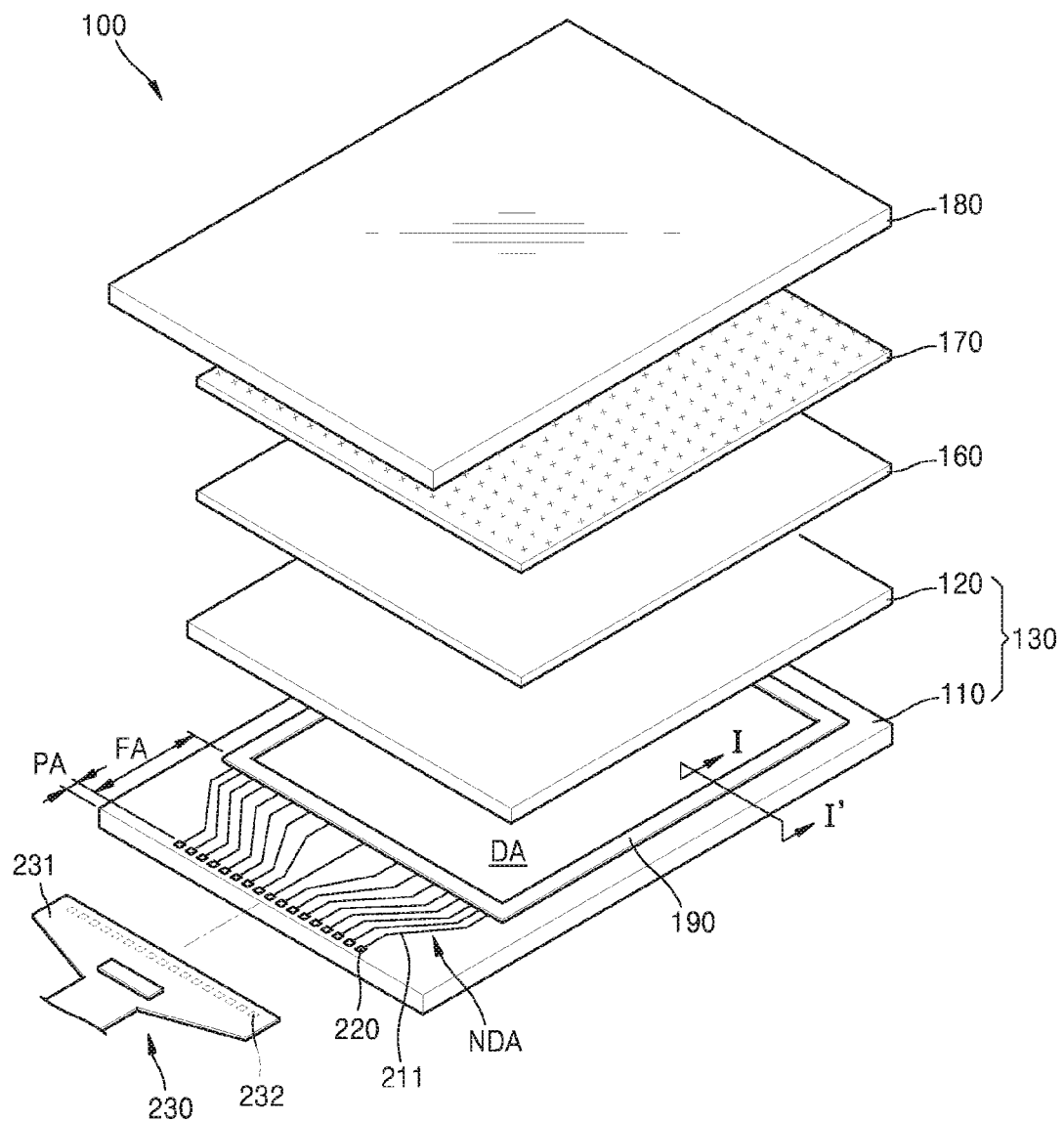
FIG. 1 is an exploded perspective view of a display apparatus according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is an exploded perspective view of a display apparatus 100 according to one or more exemplary embodiments.

FIG. 1 illustrated that the display apparatus 100 is an organic light-emitting display device (OLED). However, the exemplary embodiments are not limited thereto, and the display apparatus 100 may include any display apparatus configured to display an image by receiving an electric power including , but not limited to, liquid crystal display devices (LCDs), field emission display devices (FEDs), electronic paper display devices (EPDs), etc.

Referring to FIG. 1, the display apparatus 100 according to one or more exemplary embodiments may include a display panel 130 including a first substrate 110 and a second substrate 120 disposed on the first substrate 110.

The display panel 130 may include a display area (DA) having a display portion 200 (refer to FIG. 2) for displaying an image, and a non-display area (NDA) disposed outside the DA.

The first substrate 110 may be a rigid substrate such as a glass substrate having rigidity, and/or a polymer substrate, a flexible substrate such as a film, and/or a metal substrate, or a combination thereof.

The second substrate 120 may be a glass substrate, polymer resin, and/or a film having flexibility. The second substrate 120 may be formed by alternately stacking at least one of an organic film and an inorganic film.

A sealing member 190 for hermetically sealing the DA from the outside may be disposed between surfaces of the first substrate 110 and the second substrate 120 facing each other. According to one or more exemplary embodiment, the sealing member 190 may be disposed along edges of the first substrate 110 and the second substrate 120. For example, the sealing member 190 may have a line shape continuously formed along an edge of the DA. The sealing member 190 may include glass frit.

The display portion 200 formed in the DA may include at least one TFT and an organic light-emitting device (OLED) electrically connected to the TFT.

The NDA may include a fan-out area (FA) where a plurality of wires 211 are disposed and a pad area (PA) where a plurality of pads 220 are arranged.

The FA is an area disposed between the DA and the PA. The FA includes wires 211 from the DA including, for example, gate lines and/or data lines, electrically connected to the pads 220.

For example, in the FA, distance between the wires 211 adjacent to the DA may be greater than a distance between the wires 211 adjacent to the PA. Accordingly, FIG. 1 discloses that the wires 211 may be patterned to be obliquely arranged at a certain angle, but the exemplary embodiments are not limited thereto.

A touch screen panel 160 may be disposed on top of the second substrate 120. For example, the touch screen panel 160 may be an on-cell touch screen panel including a touch screen pattern disposed on the second substrate 120. The touch screen panel 160 may be integrally formed on the second substrate 120, but the exemplary embodiments are not limited thereto.

A polarizer 170 may be disposed on top of the touch screen panel 160. The polarizer 170 may reduce or prevent external light from being reflected from the DA.

A window cover 180 may be disposed on top surface of the polarizer 170 to protect the display panel 130, the touch screen panel 160, and the polarizer 170. The window cover 180 may include, but is not limited to, glass having rigidity.

A circuit board 230 is connected to the pads 220 to receive external signals. The circuit board 230 may include a flexible film 231 and a plurality of terminals 232 arranged at one side of the flexible film 231 and electrically connected to the pads 220. The circuit board 230 may include, but is not limited to, a flexible printed circuit board (FPCB) having flexibility.

Figure 2:
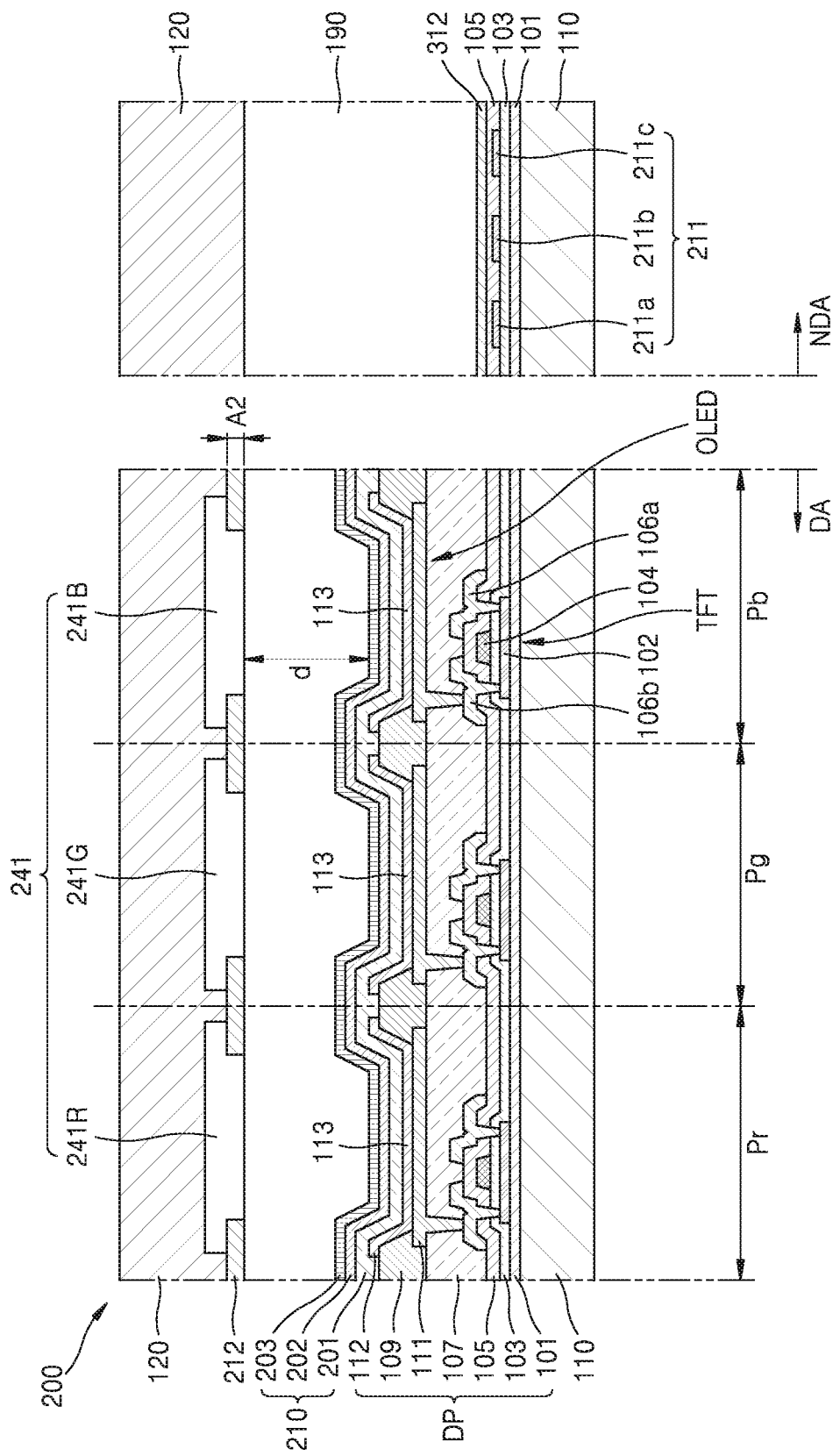
FIG. 2 is a cross-sectional view of the display apparatus taken along a sectional line I-I' of FIG. 1, according to one or more exemplary embodiments.

FIG. 2 is a cross-sectional view of the display apparatus 100 taken along a sectional line I-I' of FIG. 1, according to one or more exemplary embodiments.

Referring to FIG. 2, the DA including the display portion 200 for displaying an image and the NDA disposed outside the DA may be disposed on the first substrate 110. The DA may include a plurality of pixels arranged in a matrix format viewed from a plane.

The plurality of pixels may display visible lights of various colors. For example, the plurality of pixels may include at least a red pixel Pr generating a red light, a green pixel Pg generating a green light, and a blue pixel Pb generating a blue light.

Each of the plurality of pixels may include the OLED. The each of the plurality of pixels may include an electronic device electrically connected to the OLED. The electronic device may include at least one of TFTs and storage capacitors. The electronic device may transfer various types of electrical signals to the OLED for driving the OLED.

Although FIG. 2 illustrates that each of the plurality of pixels only include the OLED and a drive TFT for driving the OLED, this is merely for convenience of explanation, and the exemplary embodiments are not limited thereto. The each of the plurality of pixels may further include a plurality of TFTs, storage capacitors, and various wires.

The TFT may be a top gate type including an active layer 102, a gate electrode 104, a source electrode 106a, and a drain electrode 106b. Although the TFT according to FIG. 2 illustrates a top gate type TFT, the exemplary embodiments are not limited thereto and various types of TFTs may be included. For example, the display apparatus 100 according to the exemplary embodiment may include a bottom gate type TFT.

A buffer layer 101 may be disposed on an upper surface of the first substrate 110 to provide planarization and reduce or prevent intrusion of impurity elements. The buffer layer 101 may be deposited, using silicon oxide ($SiO_2$) and/or silicon nitride ($SiN_x$), by various deposition methods including, but not limited to, a plasma enhanced chemical vapor deposition (PECVD) method, an atmospheric pressure CVD (APCVD) method, and a low pressure CVD (LPCVD) method. The buffer layer 101 may be omitted if necessary.

The active layer 102 may be disposed in an area corresponding to each pixel on the buffer layer 101. The active layer 102 may be formed by patterning silicon, inorganic semiconductor such as oxide semiconductor, or organic semiconductor disposed on an entire surface of the first substrate 110 disposed on the buffer layer 101. The active layer 102 formed using silicon may include an amorphous silicon layer. The active layer 102 may also include a polycrystalline silicon layer formed by crystallizing amorphous silicon.

The active layer 102 may include a source region and a drain region, into which impurities are injected, and include a channel region disposed between the source region and the drain region.

A gate insulation film 103 for insulating the active layer 102 from the gate electrode 104 is disposed on the active layer 102. The gate insulation film 103 may include various insulation materials. For example, the gate insulation film 103 may include oxide and/or nitride.

The gate electrode 104 may be disposed in an area corresponding to the gate insulation film 103. The gate electrode 104 may be connected to a gate line, through which a TFT on/off signal is transferred to TFT.

A first interlayer insulation film 105 is disposed over the gate electrode 104. Each of the source electrode 106a and the drain electrode 106b contacts a corresponding area of the active layer 102 via a contact hole. For example, the source electrode 106a and the drain electrode 106b respectively contact the source region and the drain region of the active layer 102.

The passivation film 107 may cover the TFT to protect the TFT. The passivation film 107 may use an inorganic insulation film and/or an organic insulation film. The inorganic insulation film may include at least one of $SiO_2$, $SiN_x$, silicon oxynitride (SiON), aluminum oxide ($Al_2O_3$), titanium dioxide ($TiO_2$), tantalum pentoxide ($Ta_2O_5$), hafnium (IV) oxide ($HfO_2$), zirconium dioxide ($ZrO_2$), barium strontium titanate (BST), and/or lead zirconate titanate (PZT), whereas the organic insulation film may include a generic polymer such as poly(methyl methacrylate) (PMMA) or polystyrene (PS), a polymer derivatives having a phenol-based group, an acryl-based polymer, an imide-based polymer, an allyl ether-based polymer, an amide-based polymer, a fluorine-based polymer, a p-xylene-based polymer, a vinyl alcohol-based polymer, and a combination thereof. Furthermore, the passivation film 107 may be formed of a combined stack of the inorganic insulation film and the organic insulation film.

The OLED may be disposed on the passivation film 107 in a light emitting area.

The OLED may include a pixel electrode 111 disposed on the passivation film 107, a counter electrode 112 disposed facing the pixel electrode 111, and an intermediate layer disposed between the pixel electrode 111 and the counter electrode 112, the intermediate layer including an organic light-emitting layer.

The display apparatus 100 may be a bottom emission type, a top emission type, and a dual emission type according to a light emission direction. The bottom emission type display apparatus may include the pixel electrode 111 provided as a light transmitting electrode and the counter electrode 112 provided as a reflective electrode. The top emission type display apparatus may include the pixel electrode 111 provided as a reflective electrode and the counter electrode 112 provided as a semi-transmissive electrode. The exemplary display apparatus including the OLED illustrated in FIG. 2 may be a top emission type in which light is emitted in a direction toward an encapsulation member 210, but is not limited thereto.

The pixel electrode 111 may include a reflective film including silver (Ag), magnesium (Mg), aluminum (Al), Platinum (Pt), lead (Pd), gold (Au), Nickel (Ni), neodymium (Nd), iridium (Ir), chromium (Cr), and a compound thereof, and a light transmitting film including indium tin oxide (ITO), indium zinc oxide (IZO), zinc oxide (ZnO), and/or Indium (III) oxide ($In_2O_3$) having a high work function. The pixel electrode 111 may be patterned in an island shape corresponding to each pixel. Furthermore, the pixel electrode 111 may be connected to an external terminal to function as an anode electrode.

A pixel defining film 109 is disposed on the pixel electrode 111 covering an edge of the pixel electrode 111 to form an opening exposing a central portion of the pixel electrode 111. An organic light-emitting layer 113 configured to emit light is disposed in an area defined by the opening, accordingly defining a light-emitting area. When the light-emitting area is defined by the opening in the pixel defining film 109, a protruding portion higher than the light-emitting area is naturally formed between adjacent light-emitting areas. The protruding portion in where the organic light-emitting layer is not formed may be a non-light-emitting area.

The counter electrode 112 may be provided as a transmissive electrode and may be a metal semi-transmissive film including a thin metal such as Li, Ca, LiF/Ca, LiF/Al, Al, Mg, and/or Ag having a low work function. A light-transmitting conductive film including ITO, IZO, ZnO, or $In_2O_3$ may be further disposed on the metal semi-transmissive film, and a high resistance due to a thin thickness of the metal semi-transmissive film may be reduced. The counter electrode 112 may be formed across the entire upper surface of the first substrate 110, in the form of a common electrode. Furthermore, the counter electrode 112 may be connected to an external terminal to function as a cathode electrode. The pixel electrode 111 and the counter electrode 112 may have opposite polarities.

The intermediate layer may include the organic light-emitting layer 113 that emits light. The organic light-emitting layer 113 may include a low molecular organic material and/or a polymer organic material. Additional to the organic light-emitting layer 113, the intermediate layer may further include at least one of a hole transport layer (HTL), a hole injection layer (HIL), an electron transport layer (ETL), and an electron injection layer (EIL). The organic light-emitting layer 113 formed of a polymer organic material may include only a HTL between the organic light-emitting layer 113 and the pixel electrode 111. The polymer HTL may be disposed on the pixel electrode 111 by an inkjet printing method or a spin coating method using poly-(2,4)-ethylene-dihydroxy thiophene (PEDOT) or polyaniline (PAM).

The OLED may emit a white light by electric driving of the pixel electrode 111 and the counter electrode 112. The OLED may emit a white light using a down conversion method in which a blue or violet light is applied to excite a fluorescent material to generate light having various colors and light having a wide and abundant wave spectrum by mixing the various colors emitted from the excited fluorescent material, and a color mixing method in which a white ray is generated by mixing two basic colors such as blue and orange, or three basic colors such as red, green, and blue. However, the exemplary embodiments are not limited thereto and various materials and methods may be employed to generate a white light. Furthermore, the organic light-emitting layer 113 is not limited to generating a white light, and each of the plurality of pixels may be configured to generate one of a red light, a green light, and a blue light.

The encapsulation member 210 may be disposed over the first substrate 110 to cover the DA. The encapsulation member 210 may include a plurality of stacked insulation films. For example, the insulation films may have a structure in which an organic film 202 and inorganic films 201 and 203 are alternately stacked.

The inorganic films 201 and 203 may include a metal oxide, a metal nitride, a metal carbide, and a compound thereof. For example, the inorganic films 201 and 203 may include an aluminum oxide, a silicon oxide, and/or a silicon nitride. The inorganic films 201 and 203 may reduce or prevent intrusion of external moisture and oxygen into the OLED. The organic film 202 may include a polymer compound, and may include at least one of epoxy, acrylate, and urethane acrylate. The organic film 202 may reduce or alleviate internal stress of the inorganic films 201 and 203 and/or compensate for defects of the inorganic films 201 and 203 to planarize the inorganic films 201 and 203.

A second black matrix 212 may be disposed under the second substrate 120 facing the first substrate 110. For example, the second black matrix 212 may be arranged corresponding to the non-light-emitting area. The second black matrix 212 may include an opening corresponding to the light-emitting area. The shape of the second black matrix 212 is not limited to a rectangular section as illustrated in FIG. 2, and may include various shapes such as a trapezoid or an inverted trapezoid. The second black matrix 212 may reduce or prevent mixing of visible light having different colors generated by adjacent pixels or affecting each other in an abnormal manner. The second black matrix 212 may also protect or prevent members of the TFT from being damaged by external light.

The second black matrix 212 may include a variety of materials. For example, the second black matrix 212 may be formed using a black organic material mixed with a black pigment and/or chromium oxide ($CrO_x$). Furthermore, as described below, the second black matrix 212 may filter a part of light emitted from the light-emitting area to change an viewing angle in response to change of a distance between the OLED and the second substrate 120.

The second black matrix 212 may be disposed in various ways according to a material forming the second black matrix 212. The second black matrix 212 including chromium and/or chromium oxide may include a single film of chromium or chromium oxide formed by a sputtering or E-beam deposition method. The second black matrix 212 including chromium and/or chromium oxide may also include a 2-layered film or 3-layered film including chromium and/or chromium oxide.

A color filter 241 may be disposed corresponding to the light-emitting areas. The color filter 241 may be disposed corresponding to the openings of the second black matrix 212. For example, the color filter 241 may be disposed to fill the opening formed between the adjacent second black matrix 212 corresponding to a light-emitting area. According to FIG. 2, at least a part of the color filter 241 may overlap part of the second black matrix 212. However, the exemplary embodiments are not limited thereto, and the color filter 241 may have a thickness identical with the thickness of the second black matrix 212.

The color filter 241 may include an organic material and a coloration material dispersed in the organic material. The coloration material may be a generic dye and/or pigment, and the organic material may be a generic dispersant. The color filter 241 may selectively transmit only a light having a particular wavelength such as red, green, or blue among a white light emitted by the OLED, and absorb light having the other wavelengths. Accordingly, one of red, green, and blue rays may be emitted from each pixel. Therefore, color filters 241R, 241G, and 241B configured to generate red, green, and blue colors may be disposed corresponding to respective light-emitting areas, the respective light-emitting areas may emit red, green, and blue rays.

The NDA according to the exemplary embodiments may include the sealing member 190 disposed between the first substrate 110 and the second substrate 120, a first black matrix 312 disposed under the sealing member 190, and a plurality of wires 211 disposed under the first black matrix 312. The wires 211 and the first black matrix 312 disposed in the non-the DA are described with reference to the following drawings.

Figure 3:
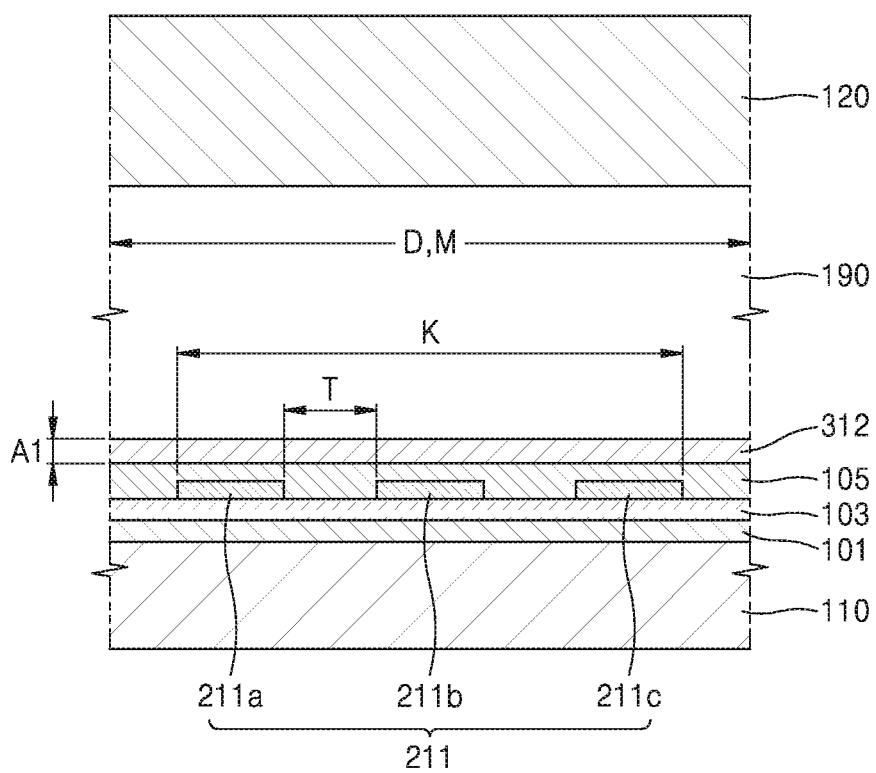
FIG. 3 is a cross-sectional view of a non-display area according to one or more exemplary embodiments.

FIG. 3 is a cross-sectional view of the NDA according to one or more exemplary embodiments.

Referring to FIG. 3, the NDA according to the exemplary embodiments may include the buffer layer 101 disposed on the first substrate 110, the gate insulation film 103 disposed on the buffer layer 101, and the first interlayer insulation film 105 disposed on the gate insulation film 103. The first substrate 110, the buffer layer 101, the gate insulation film 103, and the first interlayer insulation film 105 disposed in the NDA are substantially the same as the first substrate 110, the buffer layer 101, the gate insulation film 103, and the first interlayer insulation film 105 described related to the DA with reference to FIG. 2, detailed descriptions thereof are omitted for convenience of explanation.

The wires 211 may include a first wire 211a, a second wire 211b, and a third wire 211c, which are spaced apart from one another at a distance T, for example, equal to or greater than about 2 μm and equal to or less than about 4 μm. The wires 211 may include substantially the same material as the material of the gate electrode 104. For example, a first electric signal from a driver IC to a first gate line may be transmitted through the first wire 211a, a second electric signal from the driver IC to a second gate line may be transmitted through the second wire 211b, and a third electric signal from the driver IC to a third gate line may be transmitted through the third wire 211c.

The first, second, and third wires 211a, 211b, and 211c may be disposed on the gate insulation film 103, and the first interlayer insulation film 105 may be disposed over the first, second, and third wires 211a, 211b, and 211c. FIG. 3 illustrates that the NDA includes, for example, a plurality of insulation layers including the buffer layer 101, the gate insulation film 103, and the first interlayer insulation film 105. However, the exemplary embodiments are not limited thereto, and the structure of an insulation layer stack may have other various configurations.

The sealing member 190 may be disposed on the first interlayer insulation film 105 and may be continuously formed in a line shape along the edge of the DA as described above. A laser beam may be radiated onto the sealing member 190 disposed between the first substrate 110 and the second substrate 120 to fuse the sealing member 190 with the first substrate 110 and the second substrate 120.

The sealing member 190 according to the exemplary embodiments may extend to overlap the wires 211 disposed spaced apart from one another. Accordingly, when a laser beam is radiated onto the sealing member 190 in comparative embodiments, the wires 211 under the sealing member 190 may be thermally damaged by the laser beam. For example, the wires 211 may be heated by the radiation of a laser beam, and the heat may generate a short-circuit between the neighboring wires 211.

Furthermore, when a laser beam is radiated through the first substrate 110 by rear exposure in comparative embodiments, the distance T between the wires 211 may be increased to provide sufficient distance to transmit a laser beam to the sealing member 190. Accordingly, dead space outside the DA may increase.

According to an exemplary embodiment, the first black matrix 312 may be disposed between the sealing member 190 and the wires 211, and thus, may block the laser beam from being radiated onto the wires 211 from outside the second substrate 120. For example, the first black matrix 312 may be formed of substantially the same material and method as those of the second black matrix 212 of FIG. 2. The first black matrix 312 may have a thickness A1, for example, about 1 μm or less. For example, the thickness A1 of the first black matrix 312 may be less than a thickness A2 of the second black matrix 212 of FIG. 2. However, the exemplary embodiments are not limited thereto, and the thickness A1 of the first black matrix 312 may be the same or greater than the thickness A2 of the second black matrix 212 of FIG. 2.

According to one or more exemplary embodiments, the first black matrix 312 may be disposed between the sealing member 190 and the wires 211, for example, the first interlayer insulation film 105 and the sealing member 190. The first black matrix 312 may have a width M substantially the same or greater than a width D of the sealing member 190 to overlap the sealing member 190. Furthermore, the width M of the first black matrix 312 may be substantially the same or greater than a width K of the wires 211 to overlap the wires 211. Accordingly, the first black matrix 312 may block the laser beam radiated onto the wires 211 through the sealing member 190 and reduce or prevent damage of the wires 211. Furthermore, since there is no need to provide sufficient distance to transmit the laser beam, the distance T between the wires 211 may be decreased, thereby decreasing unnecessary dead space.

Figure 4:
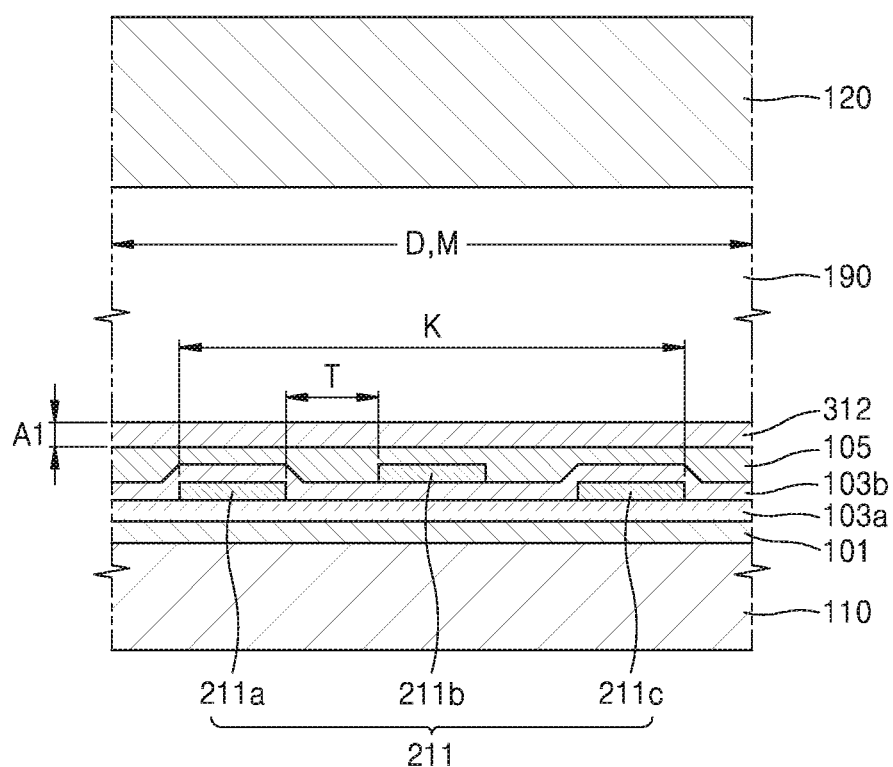
FIG. 4 is a cross-sectional view of a non-display area according to one or more exemplary embodiments.

FIG. 4 is a cross-sectional view of the NDA according to one or more exemplary embodiments.

Although the wires 211 may have a single layer structure as illustrated in FIG. 3, the first, second, and third wires 211a, 211b, and 211c may have a multilayer structure in which the first, second, and third wires 211a, 211b, and 211c are alternately arranged on different insulation layers. According to FIG. 4, a buffer layer 101 may be disposed on the first substrate 110. A first gate insulation film 103a may be disposed on the buffer layer 101. The first wire 211a and the third wire 211c may be disposed on the first gate insulation film 103a spaced apart from each other at a certain distance. A second gate insulation film 103b may be disposed on the first wire 211a and the third wire 211c. The second wire 211b may be disposed on the second gate insulation film 103b. The second wire 211b may be disposed between the first and third wires 211a and 211c spaced apart from the first and third wires 211a and 211c at a certain distance. The first interlayer insulation film 105 may be disposed on the second wire 211b. As the first and third wires 211a and 211c and the second wire 211b are insulated from each other by the second gate insulation film 103b interposed therebetween, a distance between the first, second, and third wires 211a, 211b, and 211c may be further reduced.

The first black matrix 312 may be disposed between the sealing member 190 and the wires 211, for example, a first interlayer insulation film 105 and the sealing member 190. Since the first black matrix 312 illustrated in FIG. 4 is substantially the same as the first black matrix 312 of FIG. 3, a description of the first black matrix 312 is omitted herein for convenience of explanation.

As the first black matrix 312 is disposed between the sealing member 190 and the wires 211, the first black matrix 312 may block the laser beam radiated onto the wires 211 through the sealing member 190 and reduce or prevent damage of the wires 211. Furthermore, since there is no need to provide sufficient distance to transmit the laser beam, the distance T between the wires 211 is decreased, and therefore, the wires 211 may be densely arranged, thereby decreasing unnecessary dead space.

As described above, a display apparatus according to the exemplary embodiments may include the first black matrix disposed between the sealing member and the first substrate, and the distance T between the wires may be decreased so that unnecessary dead space may be reduced by reducing or preventing short-circuit between the wires generated by a laser beam.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus comprising:
  a first substrate;
  a second substrate disposed facing the first substrate;
  a display portion disposed on a surface of the first substrate facing the second substrate, the display portion comprising a plurality of light-emitting areas;
  a sealing member disposed between the first substrate and the second substrate, the sealing member bonding the first substrate and the second substrate;
  a first black matrix disposed between the sealing member and the first substrate; and a plurality of wires disposed between the first substrate and the first black matrix, wherein the display portion comprises a thin film transistor disposed on the surface of the first substrate, and wherein the first black matrix covers the plurality of wires.

2. The display apparatus of claim 1, further comprising a second black matrix disposed on a surface of the second substrate overlapping at least a peripheral area of each of the plurality of light-emitting areas.

3. The display apparatus of claim 1, wherein the plurality of wires is disposed on a insulation layer.

4. The display apparatus of claim 1, wherein each of the plurality of wires are disposed spaced apart from one another by a distance in a first direction.

5. The display apparatus of claim 4, wherein the distance between the plurality of wires is equal to or greater than about 2 μm and equal to or less than about 4 μm.

6. The display apparatus of claim 1, wherein each of the plurality of wires disposed adjacent are disposed on different insulation layers.

7. The display apparatus of claim 1, wherein the first black matrix overlaps the sealing member.

8. The display apparatus of claim 2, wherein the first black matrix and the second black matrix comprise a same material.

9. The display apparatus of claim 2, wherein a thickness of the first black matrix is smaller than a thickness of the second black matrix.

10. The display apparatus of claim 9, wherein the thickness of the first black matrix is equal to or less than about 1 μm.

11. The display apparatus of claim 1, further comprising an insulation layer disposed between the plurality of wires and the first black matrix.

12. The display apparatus of claim 1, wherein the sealing member is disposed along a continuous line extending along an edge of the display portion.

13. The display apparatus of claim 1, wherein the display portion comprises:

an organic light-emitting device electrically connected to the thin film transistor, the organic light-emitting device comprising an intermediate layer, the intermediate layer comprising a first electrode, a second electrode, and a light-emitting area disposed between the first electrode and the second electrode.

* * * * *